(12) United States Patent
Lee (10) Patent No.: US 11,163,009 B2
(45) Date of Patent: Nov. 2, 2021

(54) APPARATUS AND METHOD FOR ESTIMATING RESISTANCE OF BATTERY

(71) Applicant: LG CHEM, LTD., Seoul (KR)

(72) Inventor: Bom-Jin Lee, Daejeon (KR)

(73) Assignee: LG Chem, Ltd., Seoul (KR)

( * ) Notice: Subject to any disclaimer, the term of this patent is extended or adjusted under 35 U.S.C. 154(b) by 95 days.

(21) Appl. No.: 16/608,542

(22) PCT Filed: Aug. 29, 2018

(86) PCT No.: PCT/KR2018/010006
§ 371 (c)(1),
(2) Date: Oct. 25, 2019

(87) PCT Pub. No.: WO2019/078478
PCT Pub. Date: Apr. 25, 2019

(65) Prior Publication Data
US 2020/0200829 A1    Jun. 25, 2020

(30) Foreign Application Priority Data

Oct. 20, 2017  (KR) ........................ 10-2017-0136782

(51) Int. Cl.
*G01R 31/389* (2019.01)
*G01R 31/36* (2020.01)
*G01R 31/367* (2019.01)

(52) U.S. Cl.
CPC .......... *G01R 31/389* (2019.01); *G01R 31/36* (2013.01); *G01R 31/367* (2019.01)

(58) Field of Classification Search
CPC .... G01R 31/389; G01R 31/367; G01R 31/36; G01R 31/374
See application file for complete search history.

(56) References Cited

U.S. PATENT DOCUMENTS

2006/0186890 A1    8/2006  Iwane et al.
2007/0001679 A1    1/2007  Cho et al.
(Continued)

FOREIGN PATENT DOCUMENTS

CN    106291372 A    1/2017
CN    106645953 A    5/2017
(Continued)

OTHER PUBLICATIONS

Extended European Search Report dated Jul. 17, 2020, issued in corresponding European Patent Application No. 18868574.7.
(Continued)

*Primary Examiner* — Manuel L Barbee
(74) *Attorney, Agent, or Firm* — Morgan, Lewis & Bockius LLP (57) ABSTRACT

An apparatus for estimating a resistance of a battery includes: a sensing unit configured to measure voltage, current and temperature of a battery; and a processor operably coupled to the sensing unit, wherein the processor calculates a measured resistance of the battery by using the voltage and the current of the battery, determines whether an operation state of the battery corresponds to a resistance correcting condition, corrects the measured resistance by using a resistance increase/decrease rate of a beginning of life (BOL) resistance of the battery according to a charge/discharge rate when the operation state of the battery corresponds to the resistance correcting condition, and determines the corrected measured resistance as a resistance of the battery.

9 Claims, 3 Drawing Sheets

(56) References Cited

U.S. PATENT DOCUMENTS

| | | | |
|---|---|---|---|
| 2010/0042345 A1* | 2/2010 | Kang | G01R 31/389 |
| | | | 702/65 |
| 2011/0112782 A1 | 5/2011 | Majima et al. | |
| 2015/0357852 A1 | 12/2015 | Nakao et al. | |
| 2016/0097819 A1 | 4/2016 | Ohkawa et al. | |
| 2016/0327613 A1 | 11/2016 | Tenmyo et al. | |
| 2016/0372935 A1 | 12/2016 | Sakata et al. | |
| 2017/0246963 A1* | 8/2017 | Lee | B60L 53/65 |

FOREIGN PATENT DOCUMENTS

| | | |
|---|---|---|
| JP | 2001-228226 A | 8/2001 |
| JP | 4638195 B2 | 2/2011 |
| JP | 2013-32966 A | 2/2013 |
| JP | 5323761 B2 | 10/2013 |
| JP | 2014-196985 A | 10/2014 |
| JP | 2014-215276 A | 11/2014 |
| JP | 2016-100288 A | 5/2016 |
| JP | 6026120 B2 | 11/2016 |
| KR | 10-0756837 B1 | 9/2007 |
| KR | 10-2013-0127828 A | 11/2013 |
| KR | 10-2016-0080802 A | 7/2016 |
| KR | 20160103396 A * | 9/2016 |
| KR | 10-1763502 B1 | 7/2017 |
| KR | 10-1783918 B1 | 10/2017 |
| WO | 2016/121151 A1 | 8/2016 |

OTHER PUBLICATIONS

International Search Report issued in corresponding International Patent Application No. PCT/KR2018/010006, dated Dec. 20, 2018.
Office Action dated Mar. 10, 2021, issued in corresponding Chinese Patent Application No. 201880026868.5.

* cited by examiner

APPARATUS AND METHOD FOR ESTIMATING RESISTANCE OF BATTERY

TECHNICAL FIELD

The present application claims priority to Korean Patent Application No. 10-2017-0136782 filed on Oct. 20, 2017 in the Republic of Korea, the disclosures of which are incorporated herein by reference.

The present disclosure relates to an apparatus and method for estimating a resistance of a battery, and more particularly, to an apparatus and method for estimating a resistance of a battery by using a resistance increase/decrease rate of a beginning of life (BOL) resistance of the battery according to a charge/discharge rate.

BACKGROUND ART

Recently, a battery capable of repeated charging and discharging has been attracting attention as an alternative means of fossil energy.

The battery has been used mainly in traditional handheld devices such as cellular phones, video cameras, and power tools. In recent years, however, the battery is applied to more fields such as vehicles driven by electricity (EV, HEV, PHEV), large capacity electric power storages (ESS), uninterruptible power supply systems (UPS) and the like.

The battery includes a positive electrode, a negative electrode, a separator interposed between the electrodes, and an electrolyte that reacts electrochemically with active materials coated on the positive electrode and the negative electrode.

The capacity of the battery decreases as the charge/discharge cycles increase. The decrease of capacity may be due to deterioration of the active material coated on the electrode, negative reaction of the electrolyte, reduction of pores in the separator, and the like.

As the capacity of the battery decreases, the resistance increases and the electric energy dissipated by heat increases. Thus, if the capacity of the battery decreases below a threshold value, the performance of the battery deteriorates significantly and the amount of heat generated increases. In this case, it is needed to check or replace the battery.

In the field of battery technology, the degree of capacity decrease of the battery may be quantified by a factor called state of health (SOH).

SOH may be calculated in several ways, in one of which the SOC may be calculated by quantifying the degree of resistance increase of the resistance of the battery at the present time relative to the resistance at a beginning of life (BOL) state.

For example, if the resistance of the battery is 20% greater than the resistance at the BOL state, the SOH may be estimated as 80%.

The resistance of the battery tends to be relatively large when a state of charge (SOC) is low and relatively small when the temperature is high.

If the SOC of the battery decreases, the amount of active material capable of reacting with operation ion decreases, which increases a diffusion resistance of the operation ions in the active material. Also, if the temperature of the battery rises, the mobility of the operation ions increases.

For reference, different kinds of operation ions may be used depending on the type of chemical that constitutes the battery. In a lithium-based battery, lithium ion corresponds to the operation ion.

The resistance of the battery is an essential parameter for calculating a charge output or a discharge output of the battery. However, it is difficult to accurately measure the resistance of the battery due to polarization of the active material while the battery is being charged or discharged. Thus, conventionally, a method of indirectly estimating the resistance of the battery using current, voltage and temperature of the battery has been mainly used.

One of resistance estimation methods having a simple calculation algorithm is a direct current resistance estimation method. In the DC estimation method, a voltage change amount is measured under the condition that the battery is charged or discharged by a constant current, then a resistance is calculated according to the Ohm's law ($R=\Delta V/I$), and then the calculated resistance is corrected according to temperature.

However, it is difficult to accurately measure the voltage change amount due to the polarization of the active material while the battery is being charged or discharged. Thus, the resistance calculated by the DC estimation method is less accurate depending on the polarization degree of the active material.

For example, if the SOC and temperature are the same but the polarization of the active material is different, the DC estimation method gives different calculation results for the resistance of the battery.

Meanwhile, a method of estimating a resistance of a battery using an adaptive algorithm such as an extended Kalman filter is also widely used to overcome the problem of the DC estimation method.

However, adaptive algorithms require high-performance processors with high stability since their calculating process is very complicated. Thus, if the adaptive algorithm is applied, the manufacturing cost of a battery management system is increased.

DISCLOSURE

Technical Problem

The present disclosure is designed to solve the problems of the related art, and therefore the present disclosure is directed to providing an apparatus and method for estimating a resistance of a battery, which may reduce an error of a battery resistance by correcting a measured resistance using a resistance increase/decrease rate of a BOL resistance of the battery according to a charge/discharge rate if an operation state of the battery corresponds to a resistance correcting condition, and then determining the corrected measured resistance as the resistance of the battery, so that the increase/decrease rate of the battery resistance according to the charge/discharge rate is used to calculate the battery resistance.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for estimating a resistance of a battery, comprising: a sensing unit configured to measure voltage, current and temperature of a battery; and a processor operably coupled to the sensing unit.

Preferably, the processor may calculate a measured resistance of the battery by using the voltage and the current of the battery, determine whether an operation state of the battery corresponds to a resistance correcting condition, correct the measured resistance by using a resistance increase/decrease rate of a beginning of life (BOL) resistance of the battery according to a charge/discharge rate when the operation state of the battery corresponds to the resistance correcting condition, and determine the corrected measured resistance as a resistance of the battery.

Preferably, the processor may determine that the operation state of the battery corresponds to the resistance correcting condition when at least one of a condition where a state of charge (SOC) of the battery is included in a preset SOC range and a condition where the temperature of the battery is included in a preset temperature range is satisfied.

Preferably, the processor may calculate a measured charge/discharge rate of the battery by using the voltage and the current of the battery, and calculate an increase/decrease rate of the BOL resistance according to the measured charge/discharge rate relative to the BOL resistance according to a preset reference charge/discharge rate as the resistance increase/decrease rate.

Preferably, the processor may calculate the resistance increase/decrease rate using an equation below:

$$\Delta R_{0,BOL} = \frac{R_{0,BOL2} - R_{0,BOL1}}{R_{0,BOL1}} \quad \langle\text{Equation}\rangle$$

where $\Delta R_{0,BOL}$ represents the resistance increase/decrease rate, $R_{0,BOL1}$ represents the BOL resistance according to the preset reference charge/discharge rate, and $R_{0,BOL2}$ represents the BOL resistance according to the preset reference charge/discharge rate.

Preferably, the processor may correct the measured resistance by increasing or decreasing the measured resistance corresponding to the resistance increase/decrease rate.

Preferably, the processor may correct the measured resistance using an equation below:

$$R_0' = R_0 + R_0 \times \Delta R_{0,BOL} \quad \langle\text{Equation}\rangle$$

where $R_0'$ represents the corrected measured resistance, $R_0$ represents the measured resistance, and $\Delta R_{0,BOL}$ represents the resistance increase/decrease rate.

Preferably, the processor may calculate the measured resistance by using a voltage change value of the battery during a preset time and the current of the battery.

Preferably, the processor may calculate a SOC of the battery by integrating the current of the battery.

A battery pack according to the present disclosure may comprise the apparatus for estimating a resistance of a battery.

Advantageous Effects

According to the present disclosure, it is possible to reduce an error of a battery resistance by correcting a measured resistance using a resistance increase/decrease rate of a BOL resistance of the battery according to a charge/discharge rate if an operation state of the battery corresponds to a resistance correcting condition, and then determining the corrected measured resistance as the resistance of the battery, so that the increase/decrease rate of the battery resistance according to the charge/discharge rate is used to calculate the battery resistance.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
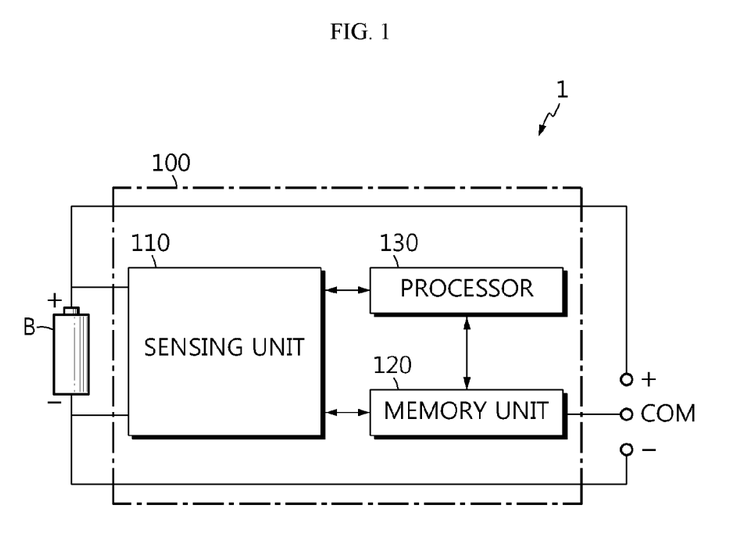
FIG. 1 is a diagram showing a configuration of an apparatus for estimating a resistance of a battery according to an embodiment of the present disclosure.
Figure 2:
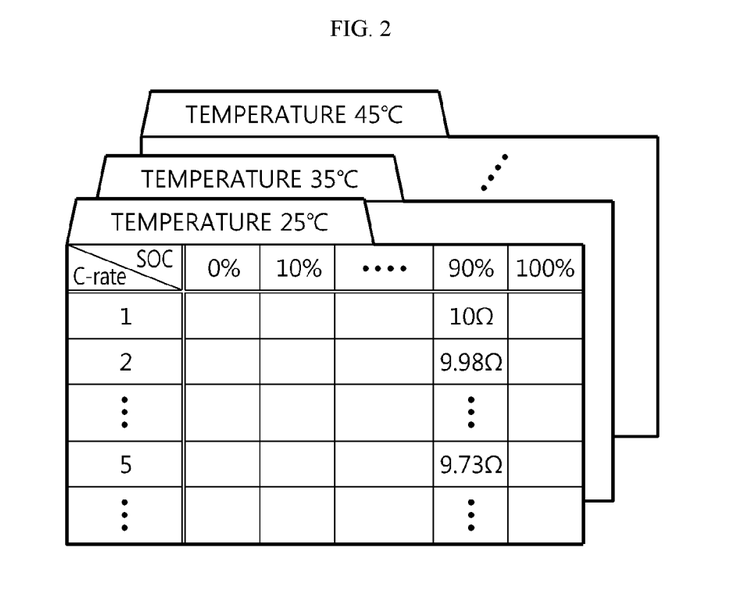
FIG. 2 is a diagram showing an example of a "look-up table of SOC and BOL resistance according to a charge/discharge rate at each temperature", used to calculate a resistance increase/decrease rate by the apparatus for estimating a resistance of a battery as shown in FIG. 1.
Figure 3:
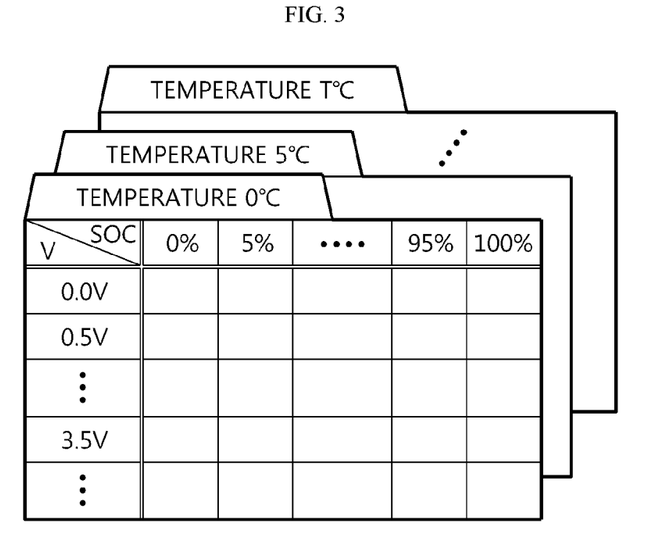
FIG. 3 is a diagram showing an example of a "look-up table of OCV and a first SOC at each temperature", used to calculate SOC by the apparatus for estimating a resistance of a battery as shown in FIG. 1.
Figure 4:
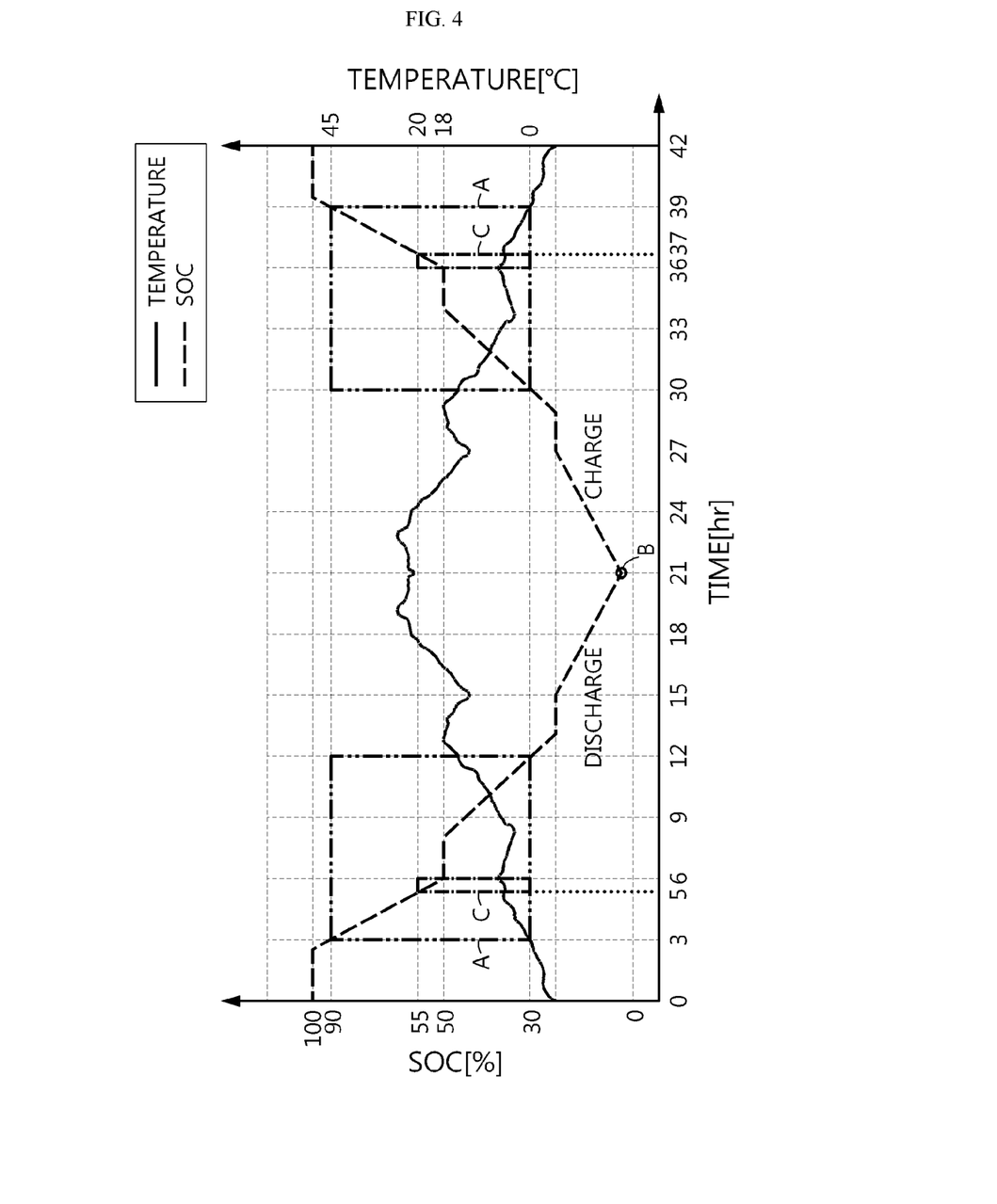
FIG. 4 is a graph showing SOC and temperature of the battery according to time.

FIG. 1 is a diagram showing a configuration of an apparatus for estimating a resistance of a battery according to an embodiment of the present disclosure, FIG. 2 is a diagram showing an example of a "look-up table of SOC and BOL resistance according to a charge/discharge rate at each temperature", used to calculate a resistance increase/decrease rate by the apparatus for estimating a resistance of a battery as shown in FIG. 1, FIG. 3 is a diagram showing an example of a "look-up table of OCV and a first SOC at each temperature", used to calculate SOC by the apparatus for estimating a resistance of a battery as shown in FIG. 1, and FIG. 4 is a graph showing SOC and temperature of the battery according to time.

Referring to FIGS. 1 to 4, an apparatus 100 for estimating a resistance of a battery (hereinafter, also referred to as a battery resistance estimation apparatus) according to an embodiment of the present disclosure is included in a battery pack 1 that has a battery B, and may be connected to the battery B to estimate a state of charge (SOC) of the battery B. For this, the battery resistance estimation apparatus 100 may include a sensing unit 110, a memory unit 120 and a processor 130.

The battery B is a minimum unit battery from which the SOC is estimated, and includes a plurality of unit cells electrically connected in series and/or in parallel. The case where the battery B includes only one unit cell is also included in the scope of the present disclosure.

The unit cell is not particularly limited as long as it is capable of being repeatedly charged and discharged. For example, the unit cell may be a lithium polymer battery in a pouch type.

The battery B may be electrically coupled to a variety of external devices through an external terminal. The external device may be, for example, an electric vehicle, a hybrid electric vehicle, an unmanned aerial vehicle such as a drone, a large capacity electric power storage system (ESS) included in a power grid, or a mobile device. In this case, the battery B may include some or all of unit cells included in a modularized battery pack mounted to the external device.

The external terminal of the battery B may be selectively coupled to a charging device. The charging device may be selectively coupled to battery B by control of the external device to which the battery B is mounted.

The sensing unit 110 is operably coupled to the processor 130. That is, the sensing unit 110 may be connected to the processor 130 to transmit an electrical signal to the processor 130 or to receive an electrical signal from the processor 130.

The sensing unit 110 may repeatedly measure the voltage applied between the positive electrode and the negative electrode of the battery B and the current flowing into or out of the battery B at preset cycles and provide a measurement signal indicating the measured voltage and current to the processor 130.

The sensing unit 110 includes a current sensor configured to measure the current of the battery B. In addition, the sensing unit 110 may further include a voltage sensor configured to measure the voltage of the battery B. Moreover, the sensing unit 110 may further include a temperature sensor configured to measure the temperature of the battery B.

If a measurement signal is received from the sensing unit 110, the processor 130 may determine digital values of the voltage, temperature and current of the battery B, respectively, through signal processing and then store the digital values in the memory unit 120.

The memory unit 120 is a semiconductor memory device that records, erases and updates data generated by the processor 130, and stores a plurality of program codes for estimating the resistance of the battery B and estimating the SOC. In addition, the memory unit 120 may store preset values of various predetermined parameters used in implementing the present disclosure.

The memory unit 120 may store the BOL resistance of the battery B in a BOL state, which is measured through a charge/discharge experiment under specific experimental conditions. More specifically, the memory unit 120 may map the SOC of the battery B and the BOL resistance of the battery B, measured from the battery B in the BOL state where a charge/discharge current flows at a predetermined charge/discharge rate, and store the mapped data as a "look-up table of SOC and BOL resistance according to a charge/discharge rate at each temperature". At this time, the memory unit 120 may store the "look-up table of SOC and BOL resistance according to a charge/discharge rate at each temperature" for each temperature of the battery B.

For example, as shown in FIG. 2, the memory unit 120 may store the "look-up table of SOC and BOL resistance according to a charge/discharge rate at each temperature" associated with the temperature "25° C." of the battery B by mapping the SOC and the BOL resistance of the battery B, measured through a charge/discharge performed under experimental conditions where the temperature of the battery B is "25° C." and a charge/discharge current flows in the battery B in the BOL state at a charge/discharge rate of "1C-rate".

In addition, as shown in FIG. 3, the memory unit 120 may store the "OCV-SOC look-up table at each temperature", which is used by the processor 130, explained later, to calculate the SOC of the battery B. In the "OCV-SOC look-up table at each temperature", the voltage of the battery B corresponding to the SOC of the battery B may be mapped at each temperature of the battery B.

The memory unit 120 may is not particularly limited as long as it is a semiconductor memory element known in the art as being capable of recording, erasing and updating data. For example, the memory unit 120 may be DRAM, SDRAM, a flash memory, ROM, EEPROM, a register, and the like. In addition, the memory unit 120 may further include a storage medium that stores program codes defining the control logics of the processor 130. The storage medium includes a non-volatile storage element such as a flash memory or a hard disk. The memory unit 120 may be physically separate from the processor 130 or may be integrated with the processor 130.

Referring to FIG. 1 again, the processor 130 may be operably coupled to the sensing unit 110. The processor 130 may calculate a measured resistance of the battery B by using the voltage and the current of the battery B, determine whether the operation state of the battery B corresponds to the resistance correcting condition, correct the measured resistance by using the resistance increase/decrease rate of the BOL resistance of the battery B according to the charge/discharge rate if the operation state of the battery B corresponds to the resistance correcting condition, and estimate the measured resistance as the resistance of the battery B.

The processor 130 may transmit a message indicating the estimated SOC to an external device via a communication terminal COM.

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

The processor 130 may calculate the measured resistance by using the current and the voltage of the battery B in real time. Here, the measured resistance may be a resistance caused by a physical characteristic such as a circuit configuration of the battery B.

The processor 130 may read the voltage and the current of the battery B measured from the currently operating battery B during a preset time from the memory unit 120 and calculate the measured resistance of the battery B by dividing the voltage change value of the battery B during the preset time according to Ohm's Law by the current of the battery B.

In the present disclosure, it has been described that the processor 130 calculates the measured resistance by using the voltage and the current of the battery B measured through the Ohm's law, the method of calculating the measured resistance of the battery B is not limit thereto as long as the measured resistance of the battery B can be calculated.

Meanwhile, the processor 130 may determine whether the operation state of the battery B corresponds to the resistance correcting condition, and determine whether to correct the calculated measured resistance according to the determination result.

Here, the operation state of the battery B may be at least one of the SOC of the battery B, the temperature of the battery B, the voltage of the battery B and the current of the battery B at the present.

In addition, the resistance correcting condition may be a condition for determining whether or not it is necessary to correct the measured resistance depending on the characteristics of the battery B.

Accordingly, if the processor 130 satisfies at least one of the condition that the SOC of the battery B is included in a preset SOC range and the condition that the temperature of the battery B is included in a preset temperature range, it is determined that the operation state of the battery B corresponds to the resistance correcting condition.

Meanwhile, if the processor 130 satisfies both the condition that the SOC of the battery B is included in the preset SOC range and the condition that the temperature of the battery B is included in the preset temperature range, it is determined that the operation state of the battery B corresponds to the resistance correcting condition.

For example, as shown in FIG. 4, if the preset SOC range is 30% to 90% and the preset temperature range is 0° C. to 45° C., the processor 130 determines to correct the measured resistance in time periods A, namely from 3 hr to 12 hr and from 30 hr to 39 hr, in which both the condition that the SOC of the battery B is included in the preset SOC range and the condition that the temperature of the battery B is included in the preset temperature range are satisfied.

By doing so, the processor 130 determines to correct the measured resistance only when the operation state of the battery B shows great change of the battery resistance, thereby preventing the measured resistance from being unnecessarily corrected.

Moreover, the preset SOC range and the preset temperature range may be set narrower in order to further strictly define the operating state of the battery B at which the processor 130 corrects the measured resistance.

For example, as shown in FIG. 4, if the preset temperature is not changed as above, namely 0° C. to 45° C., and the preset SOC range is narrowed to 50% to 55%, the processor 130 determines to correct the measured resistance only in time periods C, namely from 5 hr to 6 hr and from 36 hr to 37 hr, in which both the condition that the SOC of the battery B is included in the preset SOC range and the condition that the temperature of the battery B is included in the preset temperature range are satisfied.

Meanwhile, the processor 130 according to another embodiment may determine that the operation state of the battery B corresponds to the resistance correcting condition if the operation state of the battery B satisfies a condition that the operation state of the battery B changes from charge to discharge or from discharge to charge.

For example, as shown in FIG. 4, the processor 130 may determine to correct the measured resistance at a time point B of 21 hr, at which the operating state of the battery B changes from discharge to charge.

By doing so, the processor 130 may correct an error of the measured resistance that may occur when the operation state of the battery B changes from charge to discharge or from discharge to charge.

On the contrary, if it is determined the operation state of the battery B does not correspond to the resistance correcting condition, the processor 130 may determine the calculated measured resistance as the resistance of the battery B and store the determined resistance of the battery B in the memory unit 120.

By doing so, the processor 130 may utilize the measured resistance as the resistance of the battery B if it is not necessary to correct the measured resistance due to the characteristics of the battery B according to the operation state of the battery B.

Meanwhile, the processor 130 may calculate the SOC of the battery B that is used to determine whether the operation state of the battery B corresponds to the resistance correcting condition.

Preferably, the processor 130 may calculate the SOC of the battery B by periodic current integration by using the current of the battery B measured in real time and stored in the memory unit 120.

Specifically, when the charging or discharging of the battery B is started, the processor 130 may control the sensing unit 110 to measure the open circuit voltage (OCV) of the battery B, and calculate an initial SOC (SOC0) corresponding to the measured OCV with reference to the "OCV-SOC look-up table at each temperature" (FIG. 3). Also, while the charging or discharging is being performed, the processor 130 may calculate the SOC at the present by adding an integrated value of the charging current and the discharging current to the initial SOC (SOC0), and store the calculated SOC in the memory unit 120.

The SOC of battery B may also be calculated by other methods than the current integration method. For example, the processor 130 may adaptively calculate the SOC of the battery B by periodically inputting the voltage, current and temperature of the battery B into an adaptive filter, e.g. an extended Kalman filter. As another example, the processor 130 may calculate the SOC of the battery B by using a state feedback filter and an observing feedback filter.

Meanwhile, if the operation state of the battery B satisfies the resistance correcting condition, the processor 130 may correct the measured resistance by using the resistance increase/decrease rate of the BOL resistance of the battery B according to the charge/discharge rate.

First, if it is determined to correct the measured resistance calculated at the present time, the processor 130 may calculate a measured charge/discharge rate of the battery B at the time that the measured resistance is calculated. More specifically, the processor 130 may calculate the measured charge/discharge rate of the battery B by using the voltage and the current measured from the battery B at the time that the measured resistance is calculated.

After that, the processor 130 may read the BOL resistance according to the measured charge/discharge rate at which the temperature and the SOC of the battery B calculated at the time that the measured resistance is calculated are matched, from the "BOL resistance look-up table according to SOC and a charge/discharge rate at each temperature" shown in FIG. 2.

For example, if the temperature and the SOC of the battery B calculated at the time that the measured resistance is calculated are respectively "25° C." and "90%" and the calculated measured charge/discharge rate is "5C-rate", the processor 130 may read the BOL resistance "9.73Ω" according to the measured charge/discharge rate from the "BOL resistance look-up table according to SOC and a charge/discharge rate at each temperature". In addition, the processor 130 may read the BOL resistance according to the preset reference charge/discharge rate at which the temperature and the SOC of the battery B calculated at the time that the measured resistance is calculated are matched, from the "BOL resistance look-up table according to SOC and a charge/discharge rate at each temperature". Here, the preset reference charge/discharge rate may be 1C-rate, without being limited thereto.

For example, if the temperature and the SOC of the battery B calculated at the time that the measured resistance is calculated are respectively "25° C." and "90%" and the preset reference charge/discharge rate is "1C-rate", the processor 130 may read the BOL resistance "10Ω" according to the preset reference charge/discharge rate from the "BOL resistance look-up table according to SOC and a charge/discharge rate at each temperature".

The processor 130 may calculate the resistance increase/decrease rate by using the BOL resistance according to the measured charge/discharge rate and the BOL resistance according to the preset reference charge/discharge rate, read from the "BOL resistance look-up table according to SOC and a charge/discharge rate at each temperature".

More specifically, the processor 130 may calculate the increase/decrease rate of the BOL resistance according to the measured charge/discharge rate relative to the BOL resistance according to the preset reference charge/discharge rate as the resistance increase/decrease rate.

In the above example, the processor 130 may calculate the increase/decrease rate "−0.27%" of the BOL resistance "9.73Ω" according to the measured charge/discharge rate relative to the BOL resistance "10Ω" according to the preset reference charge/discharge rate as the resistance increase/decrease rate.

At this time, the processor 130 may calculate the resistance increase/decrease rate using Equation 1 below.

$$\Delta R_{0,BOL} = \frac{R_{0,BOL2} - R_{0,BOL1}}{R_{0,BOL1}} \quad \langle \text{Equation 1} \rangle$$

Here, $\Delta R_{0,BOL}$ represents the resistance increase/decrease rate, $R_{0,BOL1}$ represents the BOL resistance according to the preset reference charge/discharge rate, and $R_{0,BOL2}$ represents the BOL resistance according to the preset reference charge/discharge rate.

After that, the processor 130 may correct the measured resistance by increasing or decreasing the measured resistance corresponding to the calculated resistance increase/decrease rate.

More specifically, the processor 130 may apply the resistance increase/decrease rate of the BOL resistance according to the charge/discharge rate to the measured resistance after increasing or decreasing the measured resistance as much as the resistance increase/decrease rate.

In the above example, if the measured resistance is calculated as "14Ω", the processor 130 may decrease the measured resistance "14Ω" as much as the calculated resistance increase/decrease rate "−0.27%" to be corrected into "13.62Ω".

At this time, the processor 130 may correct the measured resistance using Equation 2 below.

$$R_0' = R_0 + R_0 \times \Delta R_{0,BOL} \quad \text{<Equation 2>}$$

Here, $R_0'$ represents the corrected measured resistance, $R_0$ represents the measured resistance, and $\Delta R_{0,BOL}$ represents the resistance increase/decrease rate.

After that, the processor 130 may determine the corrected measured resistance as the resistance of the battery B and store the determined resistance of the battery B in the memory unit 120.

By doing so, if it is needed to correct the measured resistance due to the characteristics of the battery B according to the operation state of the battery B, the processor 130 may increase or decrease the measured resistance as much as the resistance increase/decrease rate and then use as the resistance of the battery B.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for estimating a resistance of a battery, comprising:
   a sensing unit configured to measure voltage, current, and temperature of a battery; and
   a processor operably coupled to the sensing unit, the processor being configured to:
      calculate a measured resistance of the battery using the voltage and the current of the battery,
      determine whether an operation state of the battery corresponds to a resistance correcting condition,
      correct the measured resistance using a resistance increase/decrease rate of a beginning of life (BOL) resistance of the battery according to a charge/discharge rate when the operation state of the battery corresponds to the resistance correcting condition, and
      determine the corrected measured resistance as a resistance of the battery.

2. The apparatus for estimating a resistance of a battery according to claim 1, wherein the processor is further configured to determine that the operation state of the battery corresponds to the resistance correcting condition when at least one of a condition in which a state of charge (SOC) of the battery is included in a preset SOC range and a condition in which the temperature of the battery is included in a preset temperature range is satisfied.

3. The apparatus for estimating a resistance of a battery according to claim 1, wherein the processor is further configured to:
   calculate a measured charge/discharge rate of the battery using the voltage and the current of the battery; and
   calculate an increase/decrease rate of the BOL resistance according to the measured charge/discharge rate relative to the BOL resistance according to a preset reference charge/discharge rate as the resistance increase/decrease rate.

4. The apparatus for estimating a resistance of a battery according to claim 1, wherein the processor is further configured to calculate the resistance increase/decrease rate using an equation below:

$$\Delta R_{0,BOL} = \frac{R_{0,BOL2} - R_{0,BOL1}}{R_{0,BOL1}}. \qquad \langle \text{Equation} \rangle$$

where:
   $\Delta R_{0,BOL}$ represents the resistance increase/decrease rate,
   $\Delta R_{0,BOL1}$ represents the BOL resistance according to the preset reference charge/discharge rate, and
   $\Delta R_{0,BOL2}$ represents the BOL resistance according to the measured reference charge/discharge rate.

5. The apparatus for estimating a resistance of a battery according to claim 1, wherein the processor is further configured to correct the measured resistance by increasing or decreasing the measured resistance corresponding to the resistance increase/decrease rate.

6. The apparatus for estimating a resistance of a battery according to claim 1, wherein the processor is further configured to correct the measured resistance using an equation below:

$$R_0' = R_0 + R_0 \times \Delta R_{0,BOL} \qquad \text{<Equation>}$$

where:
   $R_0'$ represents the corrected measured resistance,
   $R_0$ represents the measured resistance, and
   $\Delta R_{0,BOL}$ represents the resistance increase/decrease rate.

7. The apparatus for estimating a resistance of a battery according to claim 1, wherein the processor is further configured to calculate the measured resistance using a voltage change value of the battery during a preset time and the current of the battery.

8. The apparatus for estimating a resistance of a battery according to claim 1, wherein the processor is further configured to calculate a state of charge (SOC) of the battery by integrating the current of the battery.

9. A battery pack, comprising an apparatus for estimating a resistance of a battery according to claim 1.

* * * * *